(12) United States Patent
Powers et al.

(10) Patent No.: US 10,950,504 B2
(45) Date of Patent: Mar. 16, 2021

(54) WAFER PROCESSING METHOD

(71) Applicant: DISCO CORPORATION, Tokyo (JP)

(72) Inventors: Zach Powers, Tokyo (JP); Xin Lu, Tokyo (JP); Kokichi Minato, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 6 days.

(21) Appl. No.: 16/701,377

(22) Filed: Dec. 3, 2019

(65) Prior Publication Data
US 2020/0176316 A1 Jun. 4, 2020

(30) Foreign Application Priority Data
Dec. 4, 2018 (JP) .............................. JP2018-227440

(51) Int. Cl.
H01L 21/78 (2006.01)
H01L 21/683 (2006.01)
H01L 21/306 (2006.01)
H01L 21/304 (2006.01)

(52) U.S. Cl.
CPC ............ H01L 21/78 (2013.01); H01L 21/304 (2013.01); H01L 21/3043 (2013.01); H01L 21/30604 (2013.01); H01L 21/30625 (2013.01); H01L 21/6835 (2013.01)

(58) Field of Classification Search
CPC ............ H01L 21/78; H01L 21/6835; H01L 21/30625; H01L 21/304; H01L 21/30604; H01L 21/3043; H01L 2221/68327; H01L 2221/6834

USPC ......................................... 438/463, 413, 464
See application file for complete search history.

(56) References Cited

U.S. PATENT DOCUMENTS

| | | | |
|---|---|---|---|
| 7,195,988 B2* | 3/2007 | Nemoto | H01L 29/0657 438/459 |
| 8,669,166 B1* | 3/2014 | Agarwal | H01L 21/6836 438/462 |
| 9,236,264 B2* | 1/2016 | Matsuzaki | H01L 21/822 |
| 9,576,835 B2* | 2/2017 | Wei | H01L 23/544 |
| 9,595,463 B2* | 3/2017 | Priewasser | H01L 21/6835 |
| 9,768,049 B2* | 9/2017 | Priewasser | H01L 21/78 |
| 9,887,156 B2* | 2/2018 | Gambino | H01L 29/0649 |
| 10,103,134 B2* | 10/2018 | Zhou | H01L 21/6835 |

(Continued)

FOREIGN PATENT DOCUMENTS

JP 2010225976 A 10/2010

Primary Examiner — Vu A Vu
(74) Attorney, Agent, or Firm — Greer Burns & Crain Ltd.

(57) ABSTRACT

A wafer processing method is used in processing a wafer including a device area and a peripheral marginal area surrounding the device area. The device area has a plurality of devices and an electrode connected to each device. The wafer processing method includes the steps of cutting a first area of the peripheral marginal area, fixing the front side of the wafer through an adhesive to a carrier substrate, grinding a back side of the wafer, supplying a chemical solution to the back side of the wafer to thereby etch the wafer such that the electrode projects from the back side of the wafer, forming an insulating film on the back side of the wafer, cutting a second area of the peripheral marginal area, the second area being not in contact with the adhesive, thereby removing the second area, and polishing the insulating film.

1 Claim, 10 Drawing Sheets

(56) References Cited

U.S. PATENT DOCUMENTS 10,325,897 B2 * 6/2019 Lee .................... H01L 24/08
2017/0294364 A1 * 10/2017 Koshimizu ......... H01L 21/6715

* cited by examiner

WAFER PROCESSING METHOD

BACKGROUND OF THE INVENTION

Field of the Invention

The present invention relates to a wafer processing method for processing a wafer such as a silicon wafer.

Description of the Related Art

A plurality of devices such as integrated circuits (ICs) and large scale integrated circuits (LSIs) are formed on a front side of a wafer. These plural devices are formed in a plurality of respective separate regions defined by a plurality of division lines (streets). The wafer thus having the plural devices is divided along the plural division lines to thereby obtain a plurality of device chips including the respective plural devices. Further, these plural device chips are packaged to manufacture a plurality of package devices. These package devices are mounted in various electronic equipment such as mobile phones and personal computers as typical examples.

With a decrease in size and thickness of electronic equipment, a decrease in thickness of each package device is required. To meet this requirement, a back side of the wafer is ground before dividing the wafer to thereby reduce the thickness of the wafer. For example, this grinding of the wafer is performed by using a grinding apparatus including a chuck table for holding the wafer and a grinding unit having a grinding wheel for grinding the wafer.

Further, in recent years, there has been put into practical use a technique of stacking a plurality of device chips and forming a through electrode (through-silicon via (TSV)) extending through the thickness of each device chip to connect the stacked device chips. By using the through electrode, the length of wiring for connecting the devices can be reduced as compared with the case of using wire bonding. Accordingly, each package device can be reduced in size and a processing speed of each device can also be improved. Various techniques have been proposed for the manufacture of a package device having a plurality of stacked device chips. For example, Japanese Patent Laid-open No. 2010-225976 discloses a technique of stacking a plurality of wafers through an adhesive to obtain a wafer stack and next cutting the wafer stack along division lines to manufacture a package device having a plurality of stacked device chips. In this technique described in Japanese Patent Laid-open No. 2010-225976, the bonding of the wafers stacked is insufficient in their peripheral areas, so that the peripheral areas of the wafers stacked are previously removed to thereby prevent scattering of the peripheral areas as broken pieces in dividing the wafer stack.

SUMMARY OF THE INVENTION

In the case of connecting the stacked device chips through the through electrode mentioned above, an electrode is embedded in the wafer so as to be connected to the device. This electrode must be exposed to the back side of the wafer to make a condition that the electrode is connectable to another device. For example, to obtain this condition, there is a method including the steps of preparing a carrier substrate for supporting the wafer, fixing the front side of the wafer through an adhesive to the carrier substrate, etching the back side of the wafer by using a chemical solution, and polishing the back side of the wafer by using a polishing pad, thereby exposing the electrode to the back side of the wafer. In etching the back side of the wafer by using the chemical solution, the chemical solution flows on a side surface (peripheral edge) of the wafer to reach the front side of the wafer, so that there is a case where a peripheral area of the adhesive applied to the front side of the wafer may be removed by the chemical solution. In this case, a peripheral area of the wafer is brought into noncontact with the adhesive, so that the wafer becomes unstable on the carrier substrate. Accordingly, when the polishing pad is pressed on the back side of the wafer in such an unstable condition in the polishing step, there is a possibility that defective processing such as chipping and cracking may occur in the peripheral area of the wafer, causing a reduction in quality of each device chip.

It is therefore an object of the present invention to provide a wafer processing method which can prevent the occurrence of defective processing of the wafer.

In accordance with an aspect of the present invention, there is provided a wafer processing method for processing a wafer including a device area and a peripheral marginal area surrounding the device area, the device area having a plurality of devices and an electrode connected to each device, the plurality of devices being formed in a plurality of respective separate regions defined by a plurality of crossing division lines formed on a front side of the wafer, the electrode being embedded in each separate region so as to extend along a thickness of each separate region, the wafer processing method including: a first cutting step of using a first cutting blade to cut a first area of the peripheral marginal area with a predetermined depth along a peripheral edge of the wafer, the first area including the peripheral edge of the wafer, thereby forming a step portion in the peripheral marginal area or removing the first area; a carrier substrate fixing step of fixing the front side of the wafer through an adhesive to a carrier substrate; a grinding step of grinding a back side of the wafer such that a thickness of the wafer becomes a value not greater than the predetermined depth, after performing the first cutting step and the carrier substrate fixing step, thereby reducing the thickness of the wafer such that the electrode is not exposed to the back side of the wafer; an etching step of supplying a chemical solution to the back side of the wafer after performing the grinding step, thereby etching the wafer to project the electrode from the back side of the wafer; an insulating film forming step of forming an insulating film on the back side of the wafer such that the electrode is covered with the insulating film, after performing the etching step; a second cutting step of using a second cutting blade to cut a second area of the peripheral marginal area along the peripheral edge of the wafer after performing the insulating film forming step, the second area being not in contact with the adhesive, thereby removing the second area; and a polishing step of making a polishing pad into pressure contact with the back side of the wafer as supplying a polishing fluid to the back side of the wafer, after performing the second cutting step, thereby polishing the insulating film so as to expose the electrode from the insulating film.

In the wafer processing method according to the present invention, the front side of the wafer is fixed through the adhesive to the carrier substrate, and the back side of the wafer is next etched by the chemical solution. Thereafter, of the peripheral marginal area of the wafer, the second area not in contact with the adhesive is removed and the insulating film formed on the back side of the wafer is next polished by the polishing pad. Accordingly, even when the peripheral area of the adhesive is etched off by the chemical solution, the polishing can be performed in the condition where the whole of the front side of the wafer is in contact with the adhesive. As a result, the occurrence of defective processing such as chipping and cracking in the peripheral marginal area of the wafer can be prevented to thereby suppress a reduction in quality of each device chip.

The above and other objects, features, and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1A:
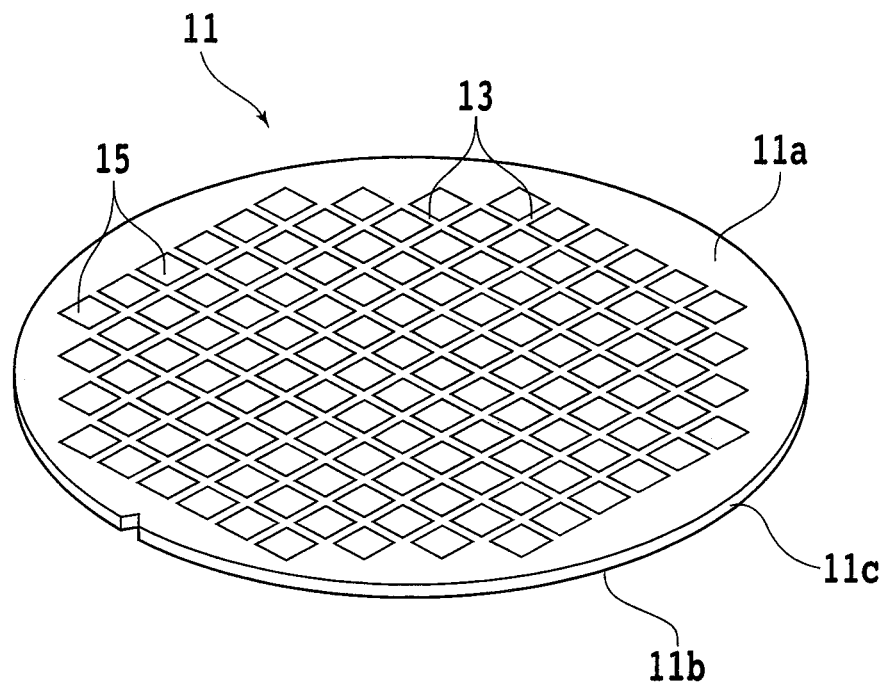
FIG. 1A is a perspective view illustrating a wafer.

A preferred embodiment of the present invention will now be described with reference to the attached drawings. There will first be described a wafer that can be processed by a wafer processing method according to this preferred embodiment. FIG. 1A is a perspective view illustrating a wafer 11.

The wafer 11 is a disk-shaped member formed of silicon, for example. The wafer 11 has a front side 11a, a back side 11b, and a peripheral edge 11c connected to the front side 11a and the back side 11b. A plurality of crossing division lines (streets) 13 are formed on the front side 11a of the wafer 11 to define a plurality of separate regions where a plurality of respective devices 15 such as integrated circuits (ICs) and large scale integrated circuits (LSIs) are formed. The wafer 11 is not limited in material, shape, structure, size, etc. For example, the wafer 11 may be formed of any semiconductors (e.g., GaAs, InP, GaN, and SiC) other than silicon or may be formed of any other materials such as glass, ceramic, resin, and metal. Further, the devices 15 are not limited in kind, number, shape, structure, size, layout, etc.

By dividing the wafer 11 along the division lines 13, a plurality of device chips including the respective devices 15 can be obtained. For example, the division of the wafer 11 may be made by using a cutting apparatus including a chuck table for holding the wafer 11 and a cutting unit having an annular cutting blade for cutting the wafer 11, the cutting blade being detachably mounted. The cutting unit includes a spindle having one end at which the cutting blade is mounted and the other end connected to a rotational drive source such as a motor. Accordingly, the cutting blade mounted on the spindle can be rotated by a drive force produced by the rotational drive source, and the wafer 11 can be cut by the cutting blade being rotated.

Figure 1B:
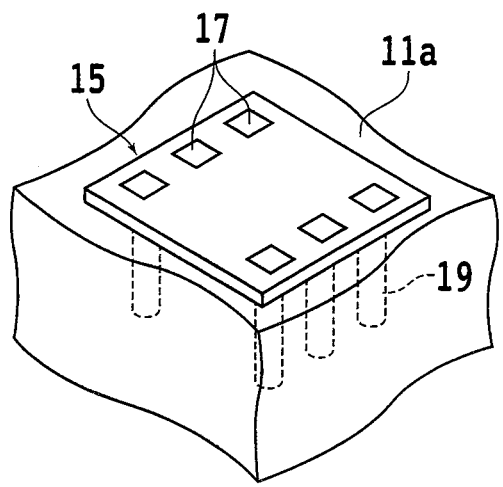
FIG. 1B is an enlarged perspective view illustrating a part of the wafer.
Figure 1C:
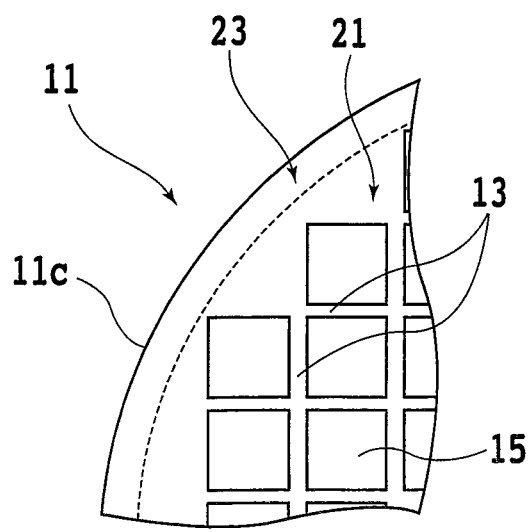
FIG. 1C is an enlarged plan view illustrating a part of the wafer.

FIG. 1B is an enlarged perspective view illustrating a part of the wafer 11. Each device 15 includes a plurality of connection electrodes 17 exposed to the front side of each device 15 and adapted to be connected to another wire, electrode, device, etc. A plurality of columnar electrodes (via electrodes or through electrodes) 19 are embedded in the wafer 11 in each of the plural separate regions defined by the division lines 13 so as to extend along the thickness of the wafer 11, the plural electrodes 19 being connected to each device 15. For example, the plural electrodes 19 are connected to the plural respective connection electrodes 17 in each device 15. Each electrode 19 extends from the device 15 toward the back side 11b of the wafer 11. The height of each electrode 19 is smaller than the thickness of the wafer 11. Accordingly, each electrode 19 is not exposed to the back side 11b of the wafer 11. That is, each electrode 19 is embedded in the wafer 11. Each electrode 19 is not limited in material. For example, each electrode 19 is formed of copper, tungsten, aluminum, or polysilicon.

Figure 10:
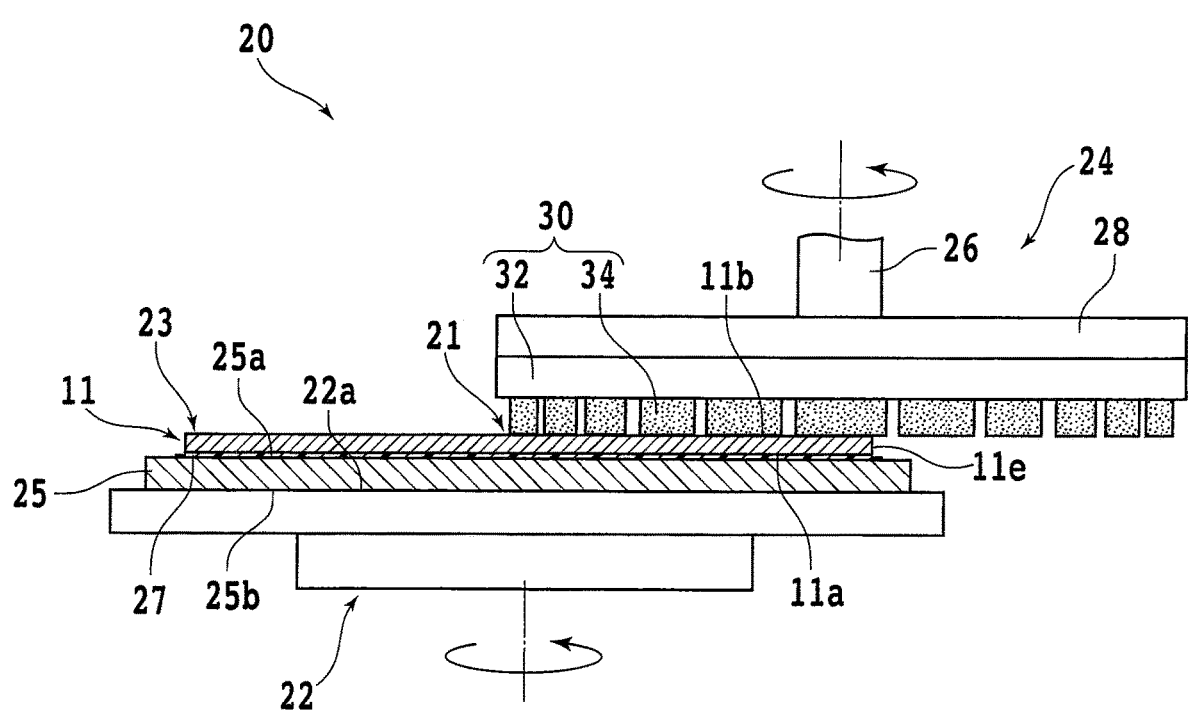
FIG. 10 is a partially sectional elevation illustrating a grinding step according to this modification.

FIG. 10 is an enlarged plan view illustrating a part of the wafer 11. The wafer 11 has a circular device area 21 where the plural devices 15 and the plural electrodes 19 are formed and an annular peripheral marginal area 23 surrounding the device area 21. The peripheral marginal area 23 includes the peripheral edge 11c of the wafer 11. The peripheral marginal area 23 corresponds to the remaining area of the wafer 11 where the devices 15 and the electrodes 19 are not formed.

By processing the back side 11b of the wafer 11 such that the electrodes 19 are exposed to the back side 11b of the wafer 11, each device 15 can be connected through the electrodes 19 to another device provided on the back side 11b of the wafer 11. In other words, the electrodes 19 function as through electrodes for connecting the stacked devices in manufacturing a package device including a plurality of device chips stacked. In the wafer processing method according to this preferred embodiment, grinding, chemical etching, and polishing are performed to the back side 11b of the wafer 11, thereby exposing the electrodes 19 to the back side 11b of the wafer 11. The wafer processing method according to this preferred embodiment will now be described in more detail.

Figure 2A:
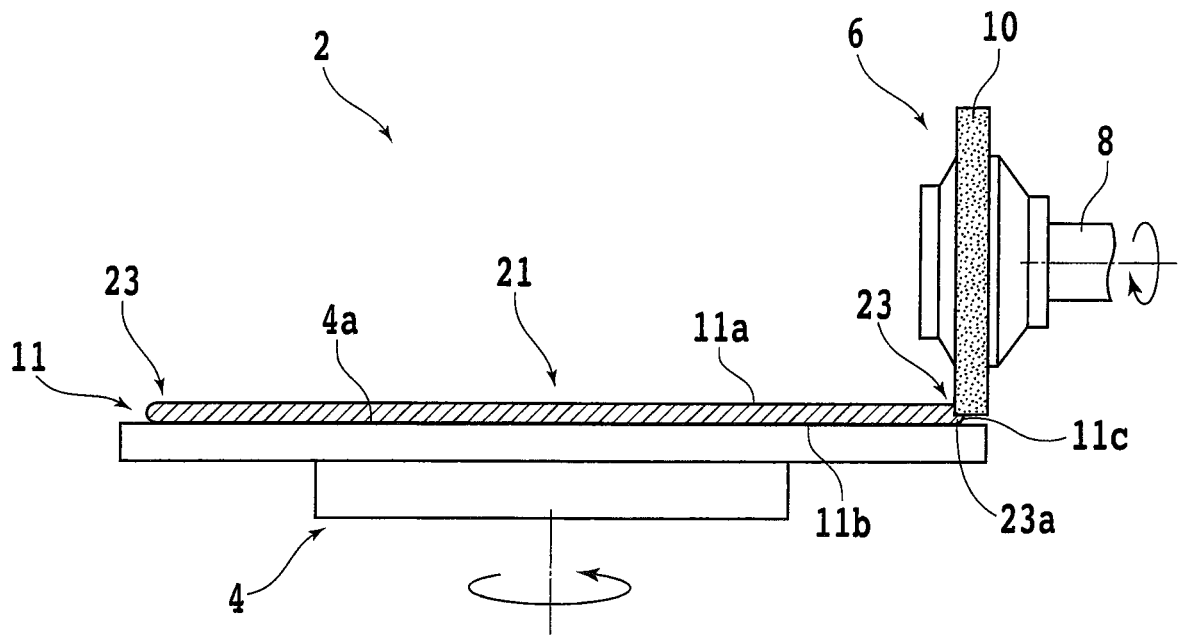
FIG. 2A is a partially sectional elevation illustrating a first cutting step.

First, a first cutting blade is used to cut an outer portion of the peripheral marginal area 23 along the peripheral edge 11c of the wafer 11, thereby forming a step portion in the peripheral marginal area 23 (first cutting step). FIG. 2A is a partially sectional elevation illustrating the first cutting step. For example, the first cutting step is performed by using a cutting apparatus 2.

The cutting apparatus 2 includes a chuck table 4 for holding the wafer 11. The chuck table 4 is connected to a rotational drive source (not illustrated) such as a motor. Accordingly, the chuck table 4 is adapted to be rotated about an axis substantially parallel to a vertical direction by this rotational drive source. Further, a moving mechanism (not illustrated) is provided below the chuck table 4. This moving mechanism functions to move the chuck table 4 in a first horizontal direction (feeding direction). The chuck table 4 has an upper surface as a holding surface 4a for holding the wafer 11. The holding surface 4a is connected through a suction passage (not illustrated) to a vacuum source (not illustrated), the suction passage being formed inside the chuck table 4.

A cutting unit 6 is provided above the chuck table 4. The cutting unit 6 includes a spindle housing (not illustrated), in which a spindle 8 is supported. The spindle 8 has a rotation axis substantially parallel to the holding surface 4a and substantially perpendicular to the feeding direction. The spindle 8 has one end portion exposed to the outside of the spindle housing, and an annular first cutting blade 10 is mounted on this one end portion of the spindle 8. A rotational drive source (not illustrated) such as a motor is connected to the other end of the spindle 8. Accordingly, the first cutting blade 10 mounted on the spindle 8 is adapted to be rotated by this rotational drive source. Further, the cutting unit 6 is supported by a moving mechanism (not illustrated). This moving mechanism functions to move the cutting unit 6 in a second horizontal direction (indexing direction) perpendicular to the first horizontal direction and in a vertical direction. The first cutting blade 10 is formed by binding abrasive grains such as diamond abrasive grains with a bond. Examples of the bond include a metal bond, resin bond, and vitrified bond.

In the first cutting step, the wafer 11 is placed on the chuck table 4 in the condition where the back side 11b of the wafer 11 is opposed to the holding surface 4a. Thereafter, the vacuum source is operated to apply a vacuum to the holding surface 4a. Accordingly, the wafer 11 is held under suction on the chuck table 4 in the condition where the front side 11a of the wafer 11 is exposed upward.

Figure 2B:
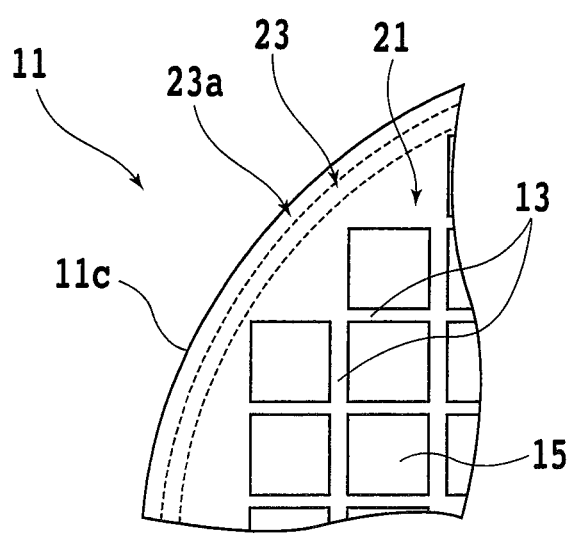
FIG. 2B is an enlarged plan view illustrating a part of a first area of a peripheral marginal area of the wafer.

Thereafter, the peripheral marginal area 23 of the wafer 11 held on the chuck table 4 is cut by the first cutting blade 10. In the first cutting step, an outer portion of the peripheral marginal area 23 including the peripheral edge 11c of the wafer 11 is defined as a first area 23a. The first area 23a of the peripheral marginal area 23 on the front side 11a of the wafer 11 is cut by the first cutting blade 10. FIG. 2B is an enlarged plan view illustrating the first area 23a of the peripheral marginal area 23. As illustrated in FIG. 2B, the peripheral marginal area 23 has the first area 23a as an annular portion including the peripheral edge 11c of the wafer 11. In the first cutting step, the cutting unit 6 is adjusted in position such that the first cutting blade 10 cuts the first area 23a by a predetermined depth from the front side 11a of the wafer 11. The first cutting blade 10 has a thickness not less than the width of the first area 23a, for example.

In adjusting the position of the cutting unit 6, the height of the cutting unit 6 is first adjusted such that the lower end of the first cutting blade 10 becomes lower in level than the front side 11a of the wafer 11 and upper in level than the back side 11b of the wafer 11. More specifically, the first cutting blade 10 is set such that the difference in height between the lower end of the first cutting blade 10 and the front side 11a of the wafer 11 (i.e., this difference corresponds to the depth of cut by the first cutting blade 10) becomes a predetermined value. The depth of cut by the first cutting blade 10 is set to a value not less than a target value for the thickness of the wafer 11 ground in a subsequent grinding step to be hereinafter described (i.e., this target value corresponds to a finished thickness of the wafer 11 in the grinding step). In addition to this height adjustment, the horizontal position of the cutting unit 6 in the indexing direction (the lateral direction in the sheet plane of FIG. 2A) is adjusted such that the first cutting blade 10 overlaps the front side 11a of the wafer 11 in the first area 23a as viewed in elevation.

Thereafter, the first cutting blade 10 is rotated and the chuck table 4 is moved in the feeding direction (the direction perpendicular to the sheet plane of FIG. 2A), thereby relatively moving the chuck table 4 and the first cutting blade 10. As a result, the first cutting blade 10 cuts into the first area 23a from the front side 11a. Thereafter, the chuck table 4 is rotated in the condition where the first cutting blade 10 remains cutting in the first area 23a. Accordingly, the first area 23a is cut along the peripheral edge 11c of the wafer 11 by the first cutting blade 10, thereby forming an annular groove in the first area 23a. As a result, the first area 23a is thinned by an amount corresponding to the depth of cut by the first cutting blade 10, thereby forming a step portion 23b (see FIG. 3) in the peripheral marginal area 23.

Figure 3:
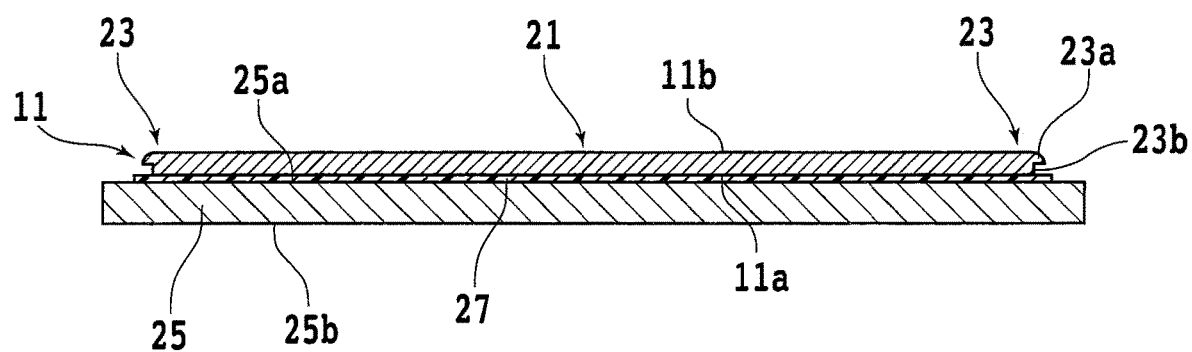
FIG. 3 is a sectional view illustrating the wafer in the condition where it is fixed to a carrier substrate.

After performing the first cutting step, the wafer 11 is fixed to a carrier substrate 25 (carrier substrate fixing step). FIG. 3 is a sectional view illustrating the wafer 11 fixed to the carrier substrate 25. The carrier substrate 25 is a rigid substrate such as a glass substrate and a silicon substrate. The carrier substrate 25 is a plate-shaped member having a front side 25a and a back side 25b.

In the carrier substrate fixing step, an adhesive 27 is applied to the front side 25a of the carrier substrate 25. The adhesive 27 is not limited in material. For example, an adhesive resin such as epoxy resin and acrylic resin may be used as the adhesive 27. The adhesive 27 may be applied to the front side 11a of the wafer 11 rather than to the front side 25a of the carrier substrate 25. Thereafter, the carrier substrate 25 and the wafer 11 are bonded to each other through the adhesive 27 in the condition where the front side 25a of the carrier substrate 25 is opposed to the front side 11a of the wafer 11. By fixing the wafer 11 to the carrier substrate 25, the wafer 11 is supported by the carrier substrate 25, so that the wafer 11 can be easily held and transferred.

Figure 4A:
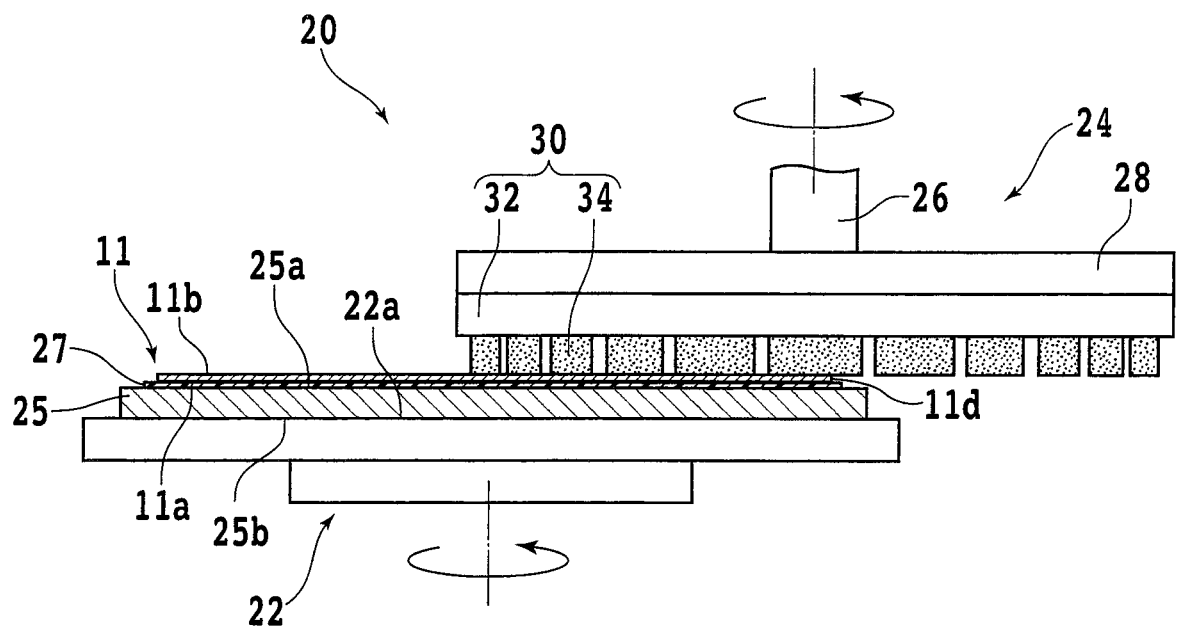
FIG. 4A is a partially sectional elevation illustrating a grinding step.

After performing the carrier substrate fixing step, the back side 11b of the wafer 11 is ground (grinding step). FIG. 4A is a partially sectional elevation illustrating the grinding step. For example, the grinding step is performed by using a grinding apparatus 20.

The grinding apparatus 20 includes a chuck table 22 for holding the wafer 11. The chuck table 22 is connected to a rotational drive source (not illustrated) such as a motor. Accordingly, the chuck table 22 is adapted to be rotated about an axis substantially parallel to a vertical direction by this rotational drive source. Further, a moving mechanism (not illustrated) is provided below the chuck table 22. This moving mechanism functions to move the chuck table 22 in a horizontal direction. The chuck table 22 has an upper surface as a holding surface 22a for holding the wafer 11.

The holding surface 22a is connected through a suction passage (not illustrated) to a vacuum source (not illustrated), the suction passage being formed inside the chuck table 22.

A grinding unit 24 is provided above the chuck table 22. The grinding unit 24 includes a spindle housing (not illustrated) supported by an elevating mechanism (not illustrated). Accordingly, the spindle housing is adapted to be vertically moved by the elevating mechanism. A spindle 26 is supported in the spindle housing. A disk-shaped mount 28 is fixed to the lower end (front end) of the spindle 26. A grinding wheel 30 is mounted on the lower surface of the mount 28. The grinding wheel 30 has substantially the same diameter as that of the mount 28. The grinding wheel 30 includes an annular base 32 formed of metal such as stainless steel and aluminum. A plurality of abrasive members 34 are fixed to the lower surface of the base 32 so as to be arranged annularly at given intervals along the outer circumference of the base 32. A rotational drive source (not illustrated) such as a motor is connected to the upper end (base end) of the spindle 26. Accordingly, the grinding wheel 30 fixed to the spindle 26 is adapted to be rotated by this rotational drive source. Further, a grinding water supply passage (not illustrated) for supplying a grinding water such as pure water is formed in the grinding unit 24. This grinding water is supplied toward the wafer 11 and the abrasive members 34 in grinding the wafer 11.

In the grinding step, the carrier substrate 25 fixed to the wafer 11 is placed on the chuck table 22 in the condition where the back side 25b of the carrier substrate 25 is opposed to the holding surface 22a. Thereafter, the vacuum source is operated to apply a vacuum to the holding surface 22a. Accordingly, the wafer 11 is held under suction through the carrier substrate 25 on the chuck table 22 in the condition where the back side 11b of the wafer 11 is exposed upward. Thereafter, the chuck table 22 is horizontally moved to the position below the grinding unit 24. Thereafter, both the chuck table 22 and the grinding wheel 30 are rotated. Further, the spindle 26 is lowered as supplying a grinding water to the back side 11b of the wafer 11. At this time, the lowering speed of the spindle 26 is adjusted such that the lower surface of each abrasive member 34 abuts against the back side 11b of the wafer 11 with a suitable force. Accordingly, the back side 11b of the wafer 11 is ground by the abrasive members 34, so that the thickness of the wafer 11 is reduced as a whole. This grinding of the wafer 11 is continued until the thickness of the wafer 11 is reduced to a predetermined thickness (the finished thickness of the wafer 11 ground).

Figure 4B:
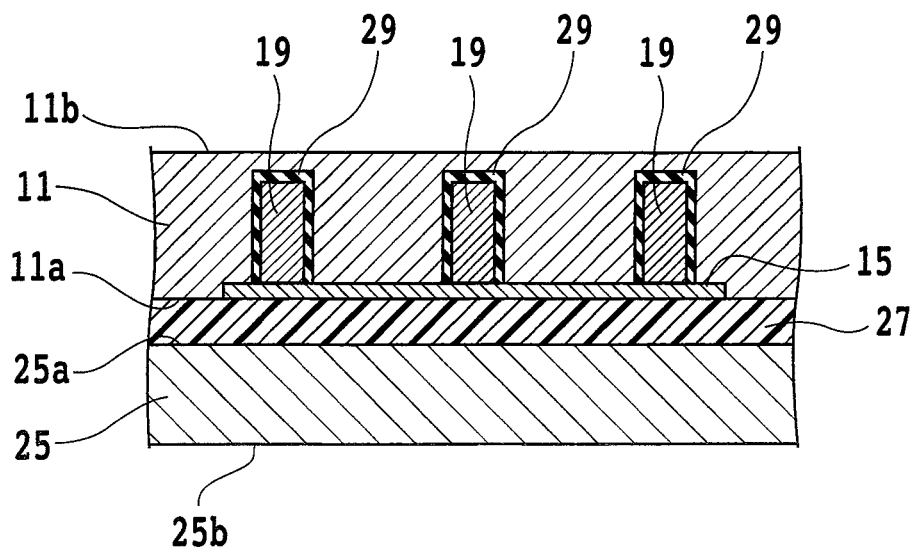
FIG. 4B is an enlarged sectional view illustrating a part of the wafer in the condition where the grinding step is finished.

FIG. 4B is an enlarged sectional view illustrating a part of the wafer 11 in the condition where the grinding step is finished. The electrodes 19 connected to each device 15 are embedded in the wafer 11. Further, an insulating film 29 is previously formed between each electrode 19 and the wafer 11 so as to cover each electrode 19. For example, the insulating film 19 is formed of silicon oxide. Accordingly, the wafer 11 and each electrode 19 are insulated from each other by the insulating film 29. The insulating film 29 may be formed by thermal oxidation or chemical vapor deposition (CVD), for example.

The amount of the wafer 11 to be ground in the grinding step is set in a range where the bottom of the groove formed in the first area 23a in the first cutting step is exposed to the back side 11b of the wafer 11 and each electrode 19 is not exposed to the back side 11b of the wafer 11 as illustrated in FIG. 4B. As a result, when the grinding step is finished, the first area 23a (see FIG. 3) of the peripheral marginal area 23 of the wafer 11 is removed.

There is a case where the peripheral edge 11c of the wafer 11 in its original condition before performing this processing method has a curved surface between the front side 11a and the back side 11b as viewed in cross section (see the left end portion of the wafer 11 illustrated in FIG. 2A). If the grinding step is performed without performing the first cutting step in this case, the peripheral edge of the wafer 11 ground becomes a sharp edge to cause a reduction in mechanical strength of the wafer 11. By performing the first cutting step before performing the grinding step as in this preferred embodiment, the first area 23a of the peripheral marginal area 23 is cut in the first cutting step and next removed in the grinding step to form a flat peripheral edge 11d (see FIG. 4A). This peripheral edge 11d of the wafer 11 ground is a flat surface substantially perpendicular to both the front side 11a and the back side 11b of the wafer 11. That is, it is possible to prevent that the peripheral edge 11d of the wafer 11 ground may become a sharp edge, so that a reduction in mechanical strength of the wafer 11 can be suppressed.

Figure 5A:
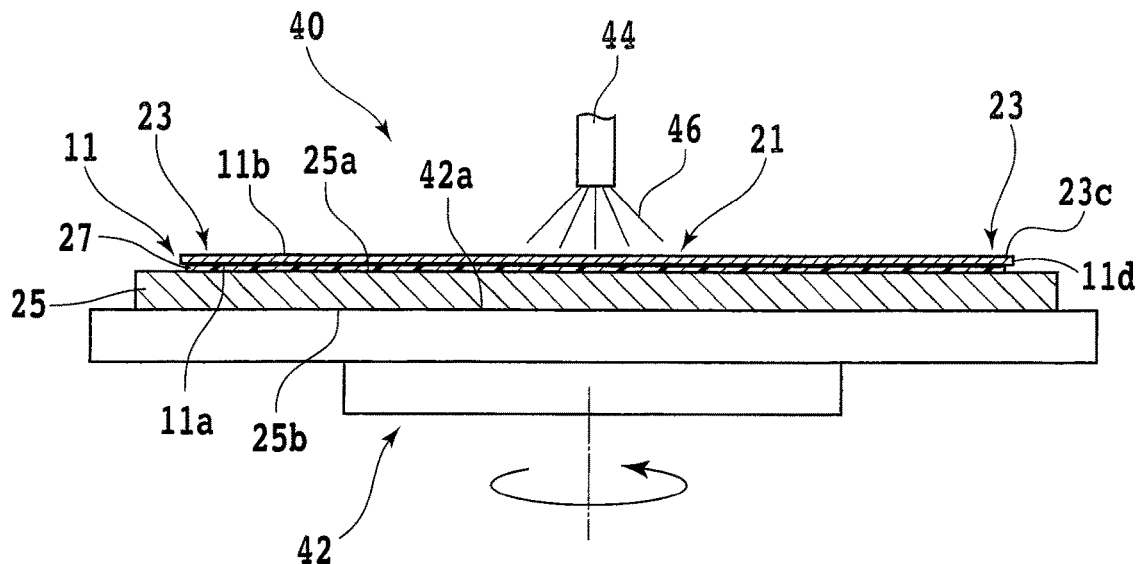
FIG. 5A is a partially sectional elevation illustrating an etching step.

After performing the grinding step, a chemical solution is supplied to the back side 11b of the wafer 11 to thereby etch the wafer 11, so that each electrode 19 covered with the insulating film 29 projects from the back side 11b of the wafer 11 (etching step). FIG. 5A is a partially sectional elevation illustrating the etching step. For example, the etching step is performed by using an etching apparatus 40.

The etching apparatus 40 includes a chuck table 42 for holding the wafer 11. The chuck table 42 is connected to a rotational drive source (not illustrated) such as a motor. Accordingly, the chuck table 42 is adapted to be rotated about an axis substantially parallel to a vertical direction by this rotational drive source. The chuck table 42 has an upper surface as a holding surface 42a for holding the wafer 11. The holding surface 42a is connected through a suction passage (not illustrated) to a vacuum source (not illustrated), the suction passage being formed inside the chuck table 42. Further, a nozzle 44 is provided above the chuck table 42 to supply a chemical solution (etching solution) 46 for etching the wafer 11 toward the chuck table 42.

In the etching step, the carrier substrate 25 fixed to the wafer 11 is placed on the chuck table 42 in the condition where the back side 25b of the carrier substrate 25 is opposed to the holding surface 42a. Thereafter, the vacuum source is operated to apply a vacuum to the holding surface 42a. Accordingly, the wafer 11 is held under suction through the carrier substrate 25 on the chuck table 42 in the condition where the back side 11b of the wafer 11 is exposed upward. Thereafter, the chemical solution 46 is discharged from the nozzle 44, and the chuck table 42 is rotated. Accordingly, the chemical solution 46 is supplied to the back side 11b of the wafer 11. The material of the chemical solution 46 is suitably selected according to the material of the wafer 11. For example, in the case of using a silicon wafer as the wafer 11, an acid mixture solution including hydrofluoric acid and nitric acid may be used as the chemical solution 46. Accordingly, the back side 11b of the wafer 11 is etched by the chemical solution 46, so that the thickness of the wafer 11 is reduced.

Figure 5B:
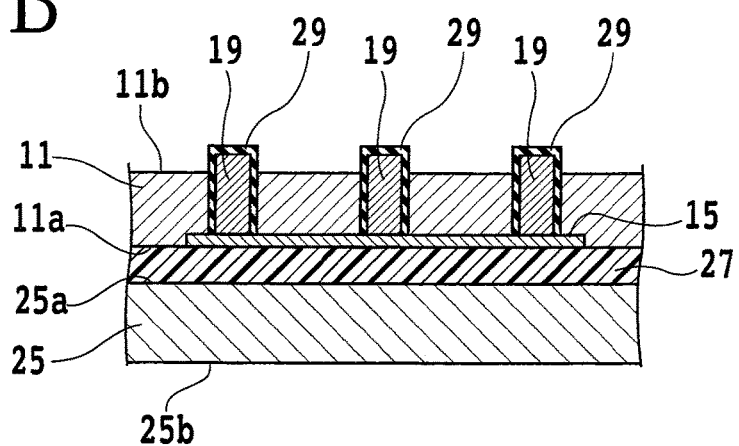
FIG. 5B is an enlarged sectional view illustrating a part of the wafer in the condition where the etching step is finished.

FIG. 5B is an enlarged sectional view illustrating a part of the wafer 11 in the condition where the etching step is finished. The etching of the wafer 11 is continued until each electrode 19 and the insulating film 29 covering each electrode 19 project upward from the back side 11b of the wafer 11 as illustrated in FIG. 5B.

Figure 5C:
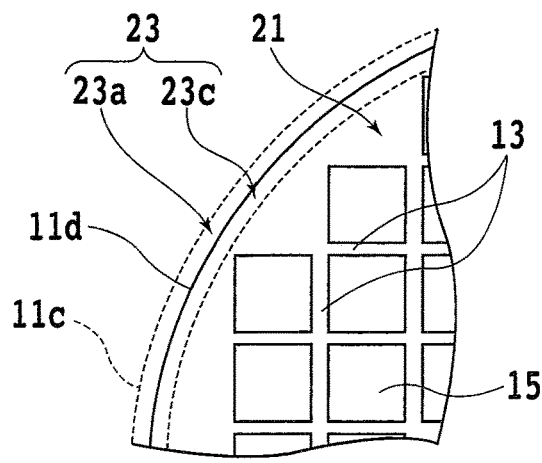
FIG. 5C is an enlarged plan view illustrating a part of the peripheral marginal area in the condition where the etching step is finished.

When the wafer 11 is etched by the chemical solution 46, the chemical solution 46 supplied to the back side 11b of the wafer 11 flows through the peripheral edge 11d to the front side 11a of the wafer 11, so that the adhesive 27 is partially removed in its peripheral area exposed in the vicinity of the peripheral edge 11d of the wafer 11. That is, this peripheral area of the adhesive 27 is removed by the chemical solution 46. As a result, at least a part of the peripheral marginal area 23 of the wafer 11 does not come into contact with the adhesive 27, but becomes an overhung condition with respect to the adhesive 27 as illustrated in FIG. 5A. FIG. 5C is an enlarged plan view illustrating a part of the peripheral marginal area 23 of the wafer 11 in the condition where the etching step is finished. When the adhesive 27 is partially removed by the chemical solution 46 as mentioned above, a second area 23c where the wafer 11 is not in contact with the adhesive 27 is formed in the peripheral marginal area 23. That is, the second area 23c corresponds to an annular area formed radially inside of the first area 23a previously removed by performing the first cutting step and the grinding step. This second area 23c is superimposed on the region where the adhesive 27 has been removed in the etching step as viewed in plan.

Figure 6A:
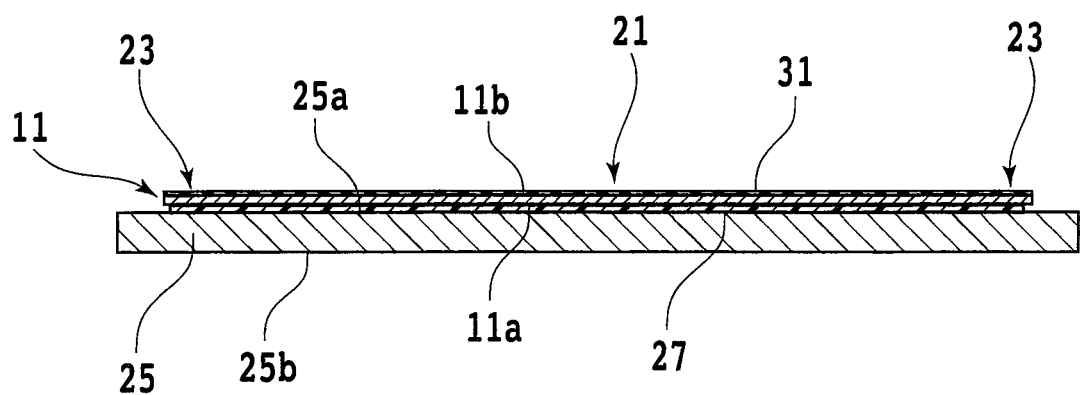
FIG. 6A is a sectional view illustrating the wafer in the condition where an insulating film is formed on a back side of the wafer by performing an insulating film forming step.
Figure 6B:
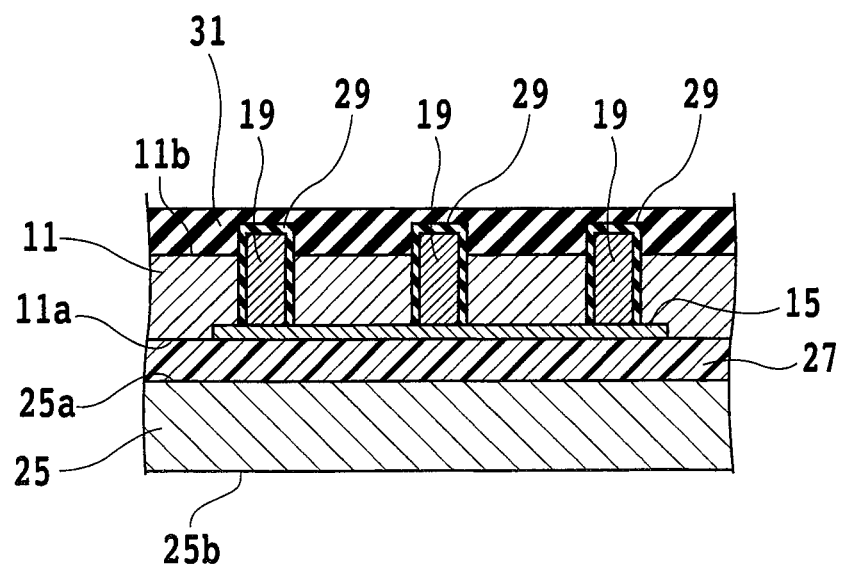
FIG. 6B is an enlarged sectional view illustrating a part of the wafer in the condition where the insulating film forming step is finished.

After performing the etching step, the back side 11b of the wafer 11 is covered with an insulating film (insulating film forming step). FIG. 6A is a sectional view illustrating the wafer 11 in the condition where an insulating film 31 is formed on the back side 11b of the wafer 11. In this insulating film forming step, the insulating film 31 is formed so as to fully cover the back side 11b of the wafer 11. Accordingly, each electrode 19 projecting from the back side 11b of the wafer 11 and the insulating film 29 covering each electrode 19 are covered with the insulating film 31. For example, the insulating film 31 is formed of silicon oxide. The insulating film 31 may be formed by sputtering or CVD, for example. This insulating film 31 functions as a passivation film for protecting the back side 11b of the wafer 11. FIG. 6B is an enlarged sectional view illustrating a part of the wafer 11 in the condition where the insulating film forming step is finished. As illustrated in FIG. 6B, the insulating film 31 is formed on the back side 11b of the wafer 11 so as to cover the front end portion (upper end portion) of each electrode 19 and the insulating film 29 covering each electrode 19, the front end portion corresponding to a portion projecting from the back side 11b of the wafer 11.

Figure 7:
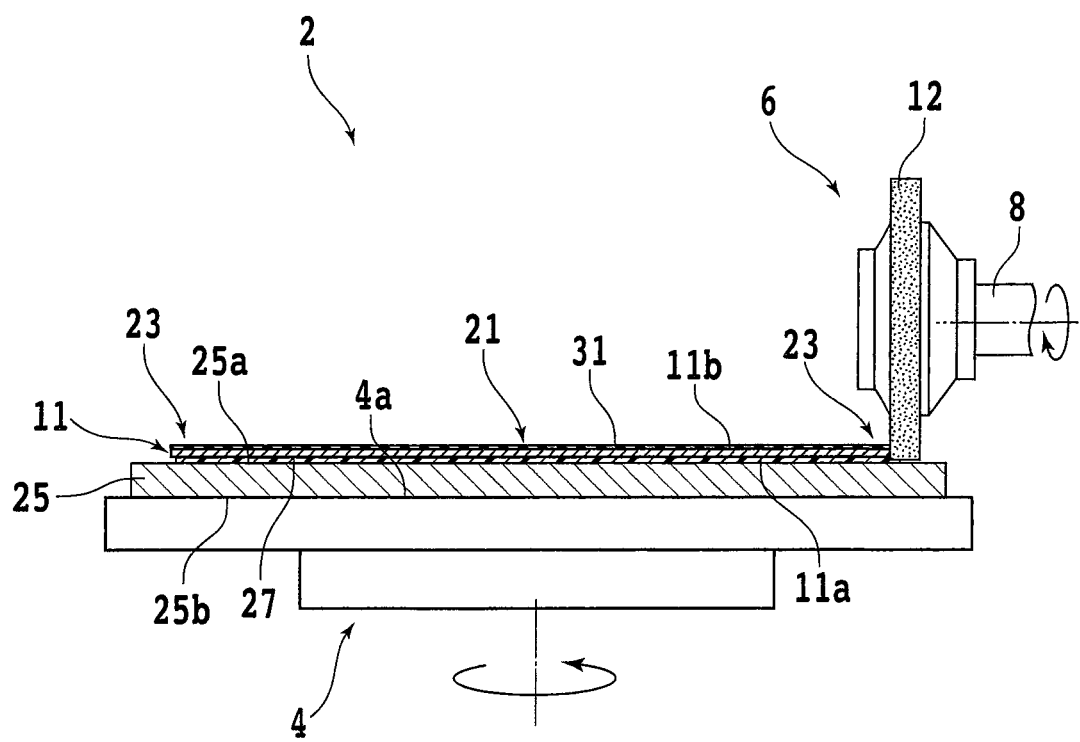
FIG. 7 is a partially sectional elevation illustrating a second cutting step.

After performing the insulating film forming step, a second cutting blade is used to cut the second area 23c of the peripheral marginal area 23 along the peripheral edge of the wafer 11, thereby removing the second area 23c (second cutting step). FIG. 7 is a partially sectional elevation illustrating the second cutting step.

As similar to the first cutting step mentioned above, the second cutting step is performed by using the cutting apparatus 2. The detail of the second cutting step is similar to that of the first cutting step and the description thereof will be omitted. In the second cutting step, an annular second cutting blade 12 is mounted on the spindle 8. The second cutting blade 12 is formed by binding abrasive grains such as diamond abrasive grains with a bond. Examples of the bond include a metal bond, resin bond, and vitrified bond. The second cutting blade 12 may be the same as the first cutting blade 10 used in the first cutting step or may be another cutting blade.

In the second cutting step, the carrier substrate 25 fixed to the wafer 11 is placed on the chuck table 4 in the condition where the back side 25b of the carrier substrate 25 is opposed to the holding surface 4a. Thereafter, the vacuum source is operated to apply a vacuum to the holding surface 4a. Accordingly, the wafer 11 is held under suction through the carrier substrate 25 on the chuck table 4 in the condition where the back side 11b (the insulating film 31) is exposed upward.

Thereafter, the peripheral marginal area 23 of the wafer 11 held on the chuck table 4 is cut by the second cutting blade 12. More specifically, of the peripheral marginal area 23, the second area 23c (see FIGS. 5A and 5C) where the wafer 11 is not in contact with the adhesive 27 is cut out by the second cutting blade 12. In the second cutting step, the height of the cutting unit 6 is first adjusted such that the lower end of the second cutting blade 12 becomes lower in level than the front side 11a of the wafer 11 (the upper surface of the adhesive 27) and upper in level than the lower surface of the adhesive 27. Further, the horizontal position of the cutting unit 6 in the indexing direction (the lateral direction in the sheet plane of FIG. 7) is adjusted such that the second cutting blade 12 overlaps the second area 23c of the peripheral marginal area 23 as viewed in elevation.

Thereafter, the second cutting blade 12 is rotated and the chuck table 4 is moved in the feeding direction (the direction perpendicular to the sheet plane of FIG. 7), thereby relatively moving the chuck table 4 and the second cutting blade 12. As a result, the second cutting blade 12 cuts into the second area 23c (see FIGS. 5A and 5C) of the peripheral marginal area 23 with a depth greater than the thickness of the wafer 11. Thereafter, the chuck table 4 is rotated in the condition where the second cutting blade 12 remains cutting in the second area 23c. Accordingly, the second area 23c is annularly cut along the peripheral edge of the wafer 11 by the second cutting blade 12. As a result, the second area 23c is removed from the wafer 11 by the second cutting blade 12. When the second area 23c is removed as mentioned above, the whole of the front side 11a of the wafer 11 comes into contact with the adhesive 27, thereby eliminating the overhung condition of the wafer 11 with respect to the adhesive 27.

Figure 8A:
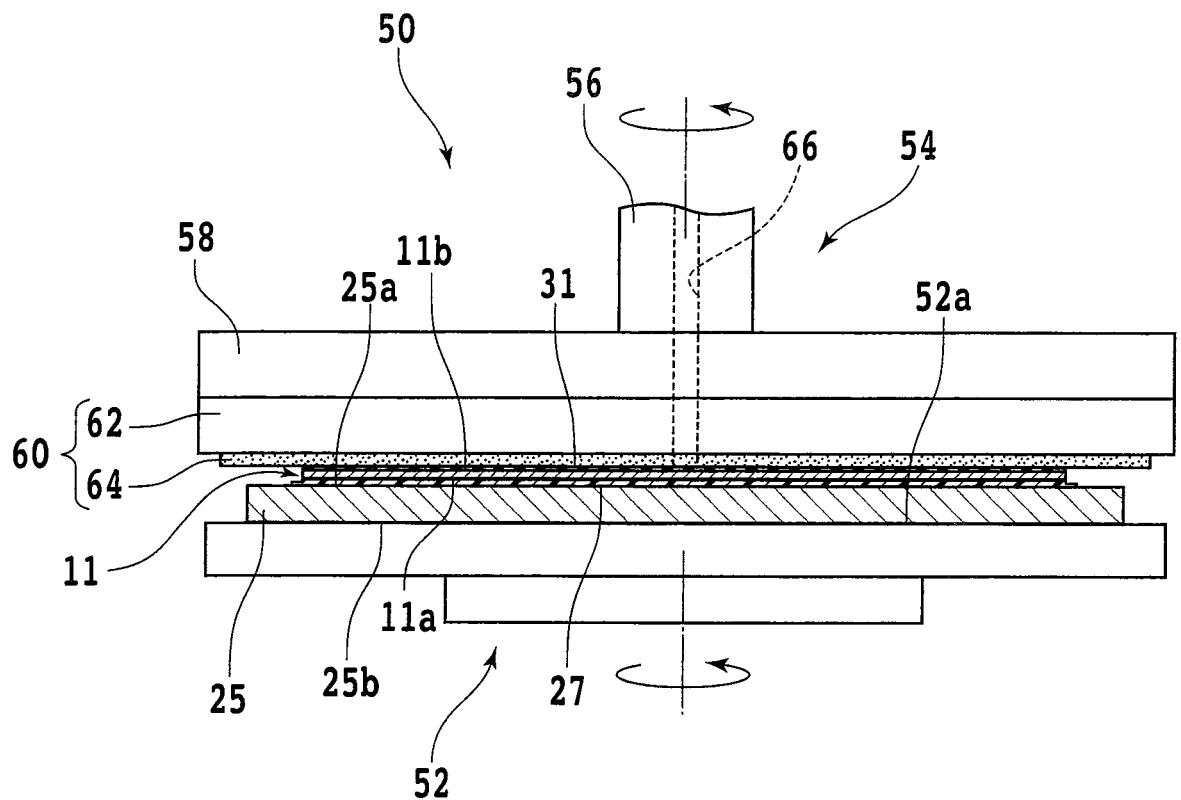
FIG. 8A is a partially sectional elevation illustrating a polishing step.

After performing the second cutting step, the back side 11b of the wafer 11 is polished to expose each electrode 19 from the insulating film 31 (polishing step). FIG. 8A is a partially sectional elevation illustrating the polishing step. For example, the polishing step is performed by using a polishing apparatus 50.

The polishing apparatus 50 includes a chuck table 52 for holding the wafer 11. The chuck table 52 is connected to a rotational drive source (not illustrated) such as a motor. Accordingly, the chuck table 52 is adapted to be rotated about an axis substantially parallel to a vertical direction by this rotational drive source. Further, a moving mechanism (not illustrated) is provided below the chuck table 52. This moving mechanism functions to move the chuck table 52 in a horizontal direction. The chuck table 52 has an upper surface as a holding surface 52a for holding the wafer 11. The holding surface 52a is connected through a suction passage (not illustrated) to a vacuum source (not illustrated), the suction passage being formed inside the chuck table 52.

A polishing unit 54 is provided above the chuck table 52. The polishing unit 54 includes a spindle housing (not illustrated) supported by an elevating mechanism (not illustrated). Accordingly, the spindle housing is adapted to be vertically moved by the elevating mechanism. A spindle 56 is supported in the spindle housing. A disk-shaped mount 58 is fixed to the lower end (front end) of the spindle 56. A disk-shaped polishing pad 60 is mounted on the lower surface of the mount 58. The polishing pad 60 has substantially the same diameter as that of the mount 58. The polishing pad 60 includes a disk-shaped base 62 formed of metal such as stainless steel and aluminum or resin such as polyphenylene sulfide (PPS). A disk-shaped polishing layer 64 is fixed to the lower surface of the base 62. A rotational drive source (not illustrated) such as a motor is connected to the upper end (base end) of the spindle 56. Accordingly, the polishing pad 60 fixed to the spindle 56 is adapted to be rotated by this rotational drive source. Further, a polishing fluid supply passage 66 for supplying a polishing fluid is formed in the polishing unit 54 so as to extend in a vertical direction and open to the lower surface of the polishing layer 64 at the center thereof. This polishing fluid is supplied through the polishing fluid supply passage 66 toward the wafer 11 and the polishing layer 64 in polishing the wafer 11.

The polishing layer 64 is formed by dispersing abrasive grains (fixed abrasive) in a nonwoven fabric or urethane foam, for example. As the abrasive grains, silica powder having a grain size in the range of 0.1 to 10 µm may be used. The grain size and material of the abrasive grains may be suitably changed according to the material of the wafer 11. In a case where the polishing layer 64 contains abrasive grains as in this preferred embodiment, a polishing fluid not containing abrasive grains is used as the polishing fluid to be supplied through the polishing fluid supply passage 66. For example, this polishing fluid may be an alkaline solution containing sodium hydroxide or potassium hydroxide, or an acid solution containing permanganate. Further, pure water may also be used as this polishing fluid. The polishing layer 64 may not contain abrasive grains. In this case, a chemical fluid (slurry) in which abrasive grains (loose abrasive) are dispersed may be used as the polishing fluid to be supplied through the polishing fluid supply passage 66. The material of the chemical fluid, the material of the abrasive grains, and the grain size of the abrasive grains may be suitably selected according to the material of the wafer 11.

In the polishing step, the carrier substrate 25 fixed to the wafer 11 is placed on the chuck table 52 in the condition where the back side 25b of the carrier substrate 25 is opposed to the holding surface 52a. Thereafter, the vacuum source is operated to apply a vacuum to the holding surface 52a. Accordingly, the wafer 11 is held under suction through the carrier substrate 25 on the chuck table 52 in the condition where the back side 11b (the insulating film 31) is exposed upward. Thereafter, the chuck table 52 is horizontally moved to the position below the polishing unit 54. Thereafter, both the chuck table 52 and the polishing pad 60 are rotated. Further, the spindle 56 is lowered as supplying a polishing fluid through the polishing fluid supply passage 66 to the insulating film 31. At this time, the lowering speed of the spindle 56 is adjusted such that the lower surface of the polishing layer 64 abuts against the insulating film 31 with a suitable force. Accordingly, the insulating film 31 is polished by the polishing layer 64.

Figure 8B:
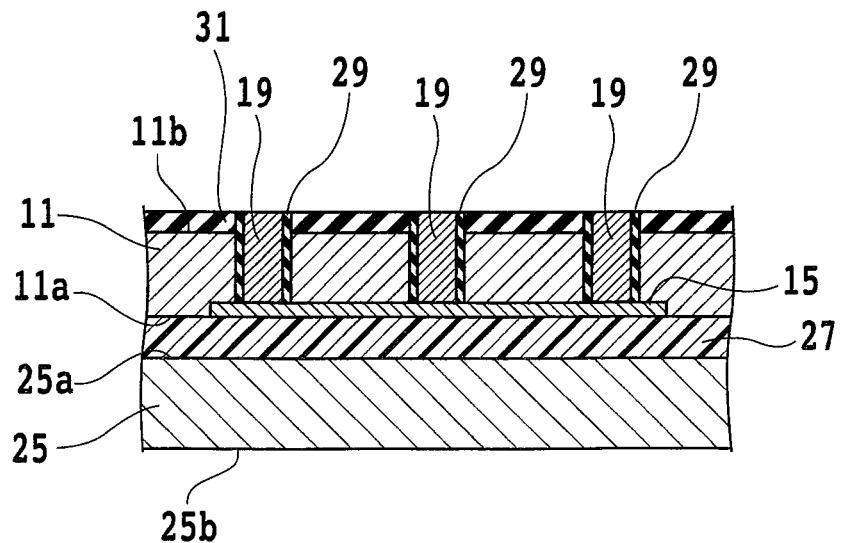
FIG. 8B is an enlarged sectional view illustrating a part of the wafer in the condition where the polishing step is finished.

FIG. 8B is an enlarged sectional view illustrating a part of the wafer 11 in the condition where the polishing step is finished. In the polishing step, the insulating film 29 and the insulating film 31 are polished until each electrode 19 is exposed from the insulating film 31. As a result, the electrodes 19 are formed inside the wafer 11 such that the electrodes 19 are connected to each device 15 and exposed to the back side 11b of the wafer 11. Thereafter, bumps (not illustrated) are formed on the back side 11b of the wafer 11 (on the insulating film 31) so as to be connected to the respective electrodes 19 as required.

If this polishing step is performed in the condition where the peripheral marginal area 23 of the wafer 11 is not in contact with the adhesive 27 as illustrated in FIG. 6A, that is, in the overhung condition of the wafer 11 with respect to the adhesive 27, the peripheral marginal area 23 becomes unstable in the polishing operation. As a result, there is a possibility of defective processing such as chipping and cracking in the peripheral marginal area 23. In the wafer processing method according to this preferred embodiment, however, the second cutting step is performed to thereby remove the second area 23c of the peripheral marginal area 23, thereby eliminating the overhung condition of the wafer 11. As a result, the whole of the front side 11a of the wafer 11 comes into contact with the adhesive 27 in performing the polishing step. That is, the peripheral marginal area 23 of the wafer 11 becomes stable in performing the polishing step. Accordingly, the occurrence of defective processing in the peripheral marginal area 23 can be prevented.

In the wafer processing method according to this preferred embodiment described above, the front side 11a of the wafer 11 is fixed through the adhesive 27 to the carrier substrate 25, and the back side 11b of the wafer 11 is next etched by the chemical solution 46. Thereafter, of the peripheral marginal area 23 of the wafer 11, the second area 23c not in contact with the adhesive 27 is removed and the insulating film 31 formed on the back side 11b of the wafer 11 is next polished by the polishing pad 60. Accordingly, even when the peripheral area of the adhesive 27 is etched off by the chemical solution 46, the polishing can be performed in the condition where the whole of the front side 11a of the wafer 11 is in contact with the adhesive 27. As a result, the occurrence of defective processing such as chipping and cracking in the peripheral marginal area 23 of the wafer 11 can be prevented to thereby suppress a reduction in quality of each device chip.

While the carrier substrate fixing step is performed after performing the first cutting step in this preferred embodiment, the first cutting step may be performed after performing the carrier substrate fixing step as a modification of the above preferred embodiment. This modification will now be described, in which the detail of the steps similar to those of the above preferred embodiment will be omitted.

First, the wafer 11 is fixed to the carrier substrate 25 (carrier substrate fixing step) before performing the first cutting step. The carrier substrate fixing step is similar to that described above with reference to FIG. 3.

Figure 9:
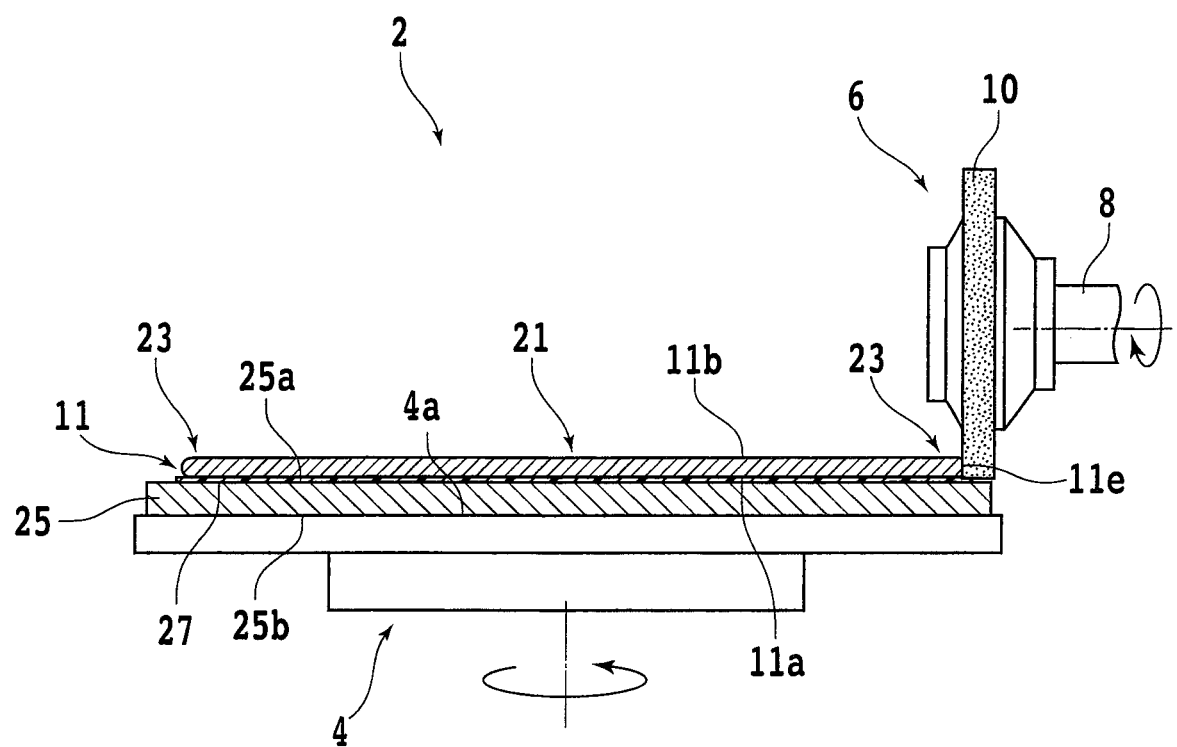
FIG. 9 is a partially sectional elevation illustrating a first cutting step according to a modification.

Thereafter, the first cutting step is performed to the wafer 11 fixed to the carrier substrate 25. FIG. 9 is a partially sectional elevation illustrating the first cutting step according to this modification. In this first cutting step, the carrier substrate 25 fixed to the wafer 11 is placed on the chuck table 4 in the condition where the back side 25b of the carrier substrate 25 is opposed to the holding surface 4a of the chuck table 4. Thereafter, the vacuum source is operated to apply a vacuum to the holding surface 4a. Accordingly, the wafer 11 is held under suction through the carrier substrate 25 on the chuck table 4 in the condition where the back side 11b of the wafer 11 is exposed upward.

Thereafter, the cutting unit 6 is adjusted in position such that the first area 23a (see FIGS. 2A and 2B) of the peripheral marginal area 23 is removed by the first cutting blade 10. More specifically, the height of the cutting unit 6 is first adjusted such that the lower end of the first cutting blade 10 becomes lower in level than the front side 11a of the wafer 11 (the upper surface of the adhesive 27). Thereafter, the chuck table 4 is horizontally moved to make the first cutting blade 10 cut into the first area 23a. Accordingly, the first cutting blade 10 cuts into the first area 23a with a depth reaching the front side 11a of the wafer 11. Thereafter, the chuck table 4 is rotated in the condition where the first cutting blade 10 remains cutting in the first area 23a. Accordingly, the first area 23a is cut out along the peripheral edge of the wafer 11 by the first cutting blade 10, so that the first area 23a is removed. In this manner, the first cutting step is performed so as to remove the first area 23a, thereby forming a flat peripheral edge 11e as illustrated in FIG. 9. That is, the peripheral edge 11e of the wafer 11 is a flat surface substantially perpendicular to both the front side 11a and the back side 11b of the wafer 11.

After performing the first cutting step, the grinding step is performed in a manner similar to that described above with reference to FIG. 4A. FIG. 10 is a partially sectional elevation illustrating the grinding step according to this modification. As illustrated in FIG. 10, the wafer 11 is ground in the condition where the peripheral edge 11e is substantially perpendicular to both the front side 11a and the back side iib of the wafer 11. Accordingly, even when the wafer 11 is thinned by this grinding, the peripheral edge 11e of the wafer 11 does not become a sharp edge, such that a reduction in mechanical strength of the wafer 11 can be suppressed.

Various other modifications may be made as in structure or method according to the above preferred embodiment without departing from the scope of the object of the present invention.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A wafer processing method for processing a wafer including a device area and a peripheral marginal area surrounding the device area, the device area having a plurality of devices and an electrode connected to each device, the plurality of devices being formed in a plurality of respective separate regions defined by a plurality of crossing division lines formed on a front side of the wafer, the electrode being embedded in each separate region so as to extend along a thickness of each separate region, the wafer processing method comprising:

a first cutting step of using a first cutting blade to cut a first area of the peripheral marginal area with a predetermined depth along a peripheral edge of the wafer, the first area including the peripheral edge of the wafer, thereby forming a step portion in the peripheral marginal area or removing the first area;

a carrier substrate fixing step of fixing the front side of the wafer through an adhesive to a carrier substrate;

a grinding step of grinding a back side of the wafer such that a thickness of the wafer becomes a value not greater than the predetermined depth, after performing the first cutting step and the carrier substrate fixing step, thereby reducing the thickness of the wafer such that the electrode is not exposed to the back side of the wafer;

an etching step of supplying a chemical solution to the back side of the wafer after performing the grinding step, thereby etching the wafer to project the electrode from the back side of the wafer;

an insulating film forming step of forming an insulating film on the back side of the wafer such that the electrode is covered with the insulating film, after performing the etching step;

a second cutting step of using a second cutting blade to cut a second area of the peripheral marginal area along the peripheral edge of the wafer after performing the insulating film forming step, the second area being not in contact with the adhesive, thereby removing the second area; and a polishing step of making a polishing pad into pressure contact with the back side of the wafer as supplying a polishing fluid to the back side of the wafer, after performing the second cutting step, thereby polishing the insulating film so as to expose the electrode from the insulating film.

* * * * *